United States Patent [19]

Pan

[11] Patent Number: 5,595,919

[45] Date of Patent: Jan. 21, 1997

[54] METHOD OF MAKING SELF-ALIGNED HALO PROCESS FOR REDUCING JUNCTION CAPACITANCE

[75] Inventor: Yang Pan, Singapore, Singapore

[73] Assignee: Chartered Semiconductor Manufacturing Pte Ltd., Singapore, Singapore

[21] Appl. No.: 603,117

[22] Filed: Feb. 20, 1996

[51] Int. Cl.$^6$ ............................................. H01L 21/8234
[52] U.S. Cl. ................................ 437/29; 437/35; 437/44
[58] Field of Search ................................. 437/27, 29, 35, 437/44

[56] References Cited

U.S. PATENT DOCUMENTS

| | | | |
|---|---|---|---|
| 4,757,026 | 7/1988 | Woo et al. | 439/29 |
| 5,032,535 | 7/1991 | Kamijo et al. | 437/44 |
| 5,089,435 | 2/1992 | Akiyama | 437/44 |
| 5,439,839 | 8/1995 | Jang | 437/44 |
| 5,491,099 | 2/1996 | Hsu | 437/35 |
| 5,498,555 | 3/1996 | Lin | 437/35 |
| 5,534,447 | 7/1996 | Hong | 437/27 |
| 5,552,329 | 9/1996 | Kim et al. | 437/29 |

*Primary Examiner*—John Niebling
*Assistant Examiner*—Richard A. Booth
*Attorney, Agent, or Firm*—George O. Saile; Rosemary L. S. Pike

[57] ABSTRACT

A method for forming an LDD structure using a self-aligned halo process is described. A gate silicon oxide layer is provided over the surface of a semiconductor substrate. A gate electrode is formed overlying the gate silicon oxide layer. A silicon oxide layer is grown on the sidewalls of the gate electrode and silicon nitride spacers are formed on the sidewalls of the silicon oxide layer. First ions are implanted into the semiconductor substrate and the substrate is annealed whereby heavily doped source and drain regions are formed within the semiconductor substrate not covered by the gate electrode and the silicon oxide and silicon nitride spacers. An oxide layer is grown over the heavily doped source and drain regions. Thereafter, the silicon nitride spacers are removed. Second ions are implanted to form lightly doped regions in the semiconductor substrate not covered by the oxide layer. Third ions are implanted to form a halo having opposite dosage and a deeper junction than the lightly doped regions. An insulating layer is deposited over the surface of the substrate. An opening is provided through the insulating layer to one of the source and drain regions. A conducting layer is deposited overlying the insulating layer and within the opening and patterned completing the fabrication of the integrated circuit device.

28 Claims, 5 Drawing Sheets

5,595,919

METHOD OF MAKING SELF-ALIGNED HALO PROCESS FOR REDUCING JUNCTION CAPACITANCE

BACKGROUND OF THE INVENTION

1. Field of the Invention

The invention relates to the fabrication of integrated circuit devices, and more particularly, to a method of both reducing short channel effects and reducing junction capacitance in the fabrication of integrated circuits.

2. Description of the Prior Art

In the fabrication of integrated circuit devices, typically heavily doped source and drain regions are formed in the semiconductor substrate after formation of the gate electrode. Lightly doped regions are normally formed in the substrate immediately adjacent to the region under the gate electrode. Halos are normally used to suppress n-channel and p-channel short channel effects. When the channel length is sufficiently short, source to drain punchthrough can be caused by drain-induced-barrier-lowering (DIBL). A halo is a pocket implant to suppress the DIBL. The halo is implanted with opposite dosage to the lightly doped source and drain implant (LDD). The halo implant is deeper both vertically and laterally than the LDD. This effectively suppresses the high electrical field regions causing punchthrough. A prior art halo implant is illustrated in FIG. 1. A polycide gate 52 has been formed over a semiconductor substrate 10. Heavily doped source and drain regions 54 and lightly doped source and drain regions 56 have been implanted. The p- halo implant 58 is illustrated.

Halos have disadvantages. By effectively increasing the well concentration at the junction boundary, the halo increases the junction capacitance. This leads to heavier loading which slows down the circuit. It is desirable to provide a process to form a halo only in the small critical region so that junction capacitance and circuit speed are not effected.

U.S. Pat. Nos. 4,757,026 to Woo et al and 5,032,535 to Kamijo et al use disposable spacers in implanting lightly doped regions.

SUMMARY OF THE INVENTION

A principal object of the present invention is to provide an effective and very manufacturable method of forming an LDD structure.

A further object of the invention is to provide a method of forming an LDD structure having reduced short channel effects while not increasing junction capacitance.

Yet another object is to provide a method of forming an LDD structure using halos having reduced short channel effects while not increasing junction capacitance.

In accordance with the objects of this invention a method for forming an LDD structure using a self-aligned halo process is achieved. A gate silicon oxide layer is provided over the surface of a semiconductor substrate. A gate electrode is formed overlying the gate silicon oxide layer. A silicon oxide layer is grown on the sidewalls of the gate electrode and silicon nitride spacers are formed on the sidewalls of the silicon oxide layer. First ions are implanted into the semiconductor substrate and the substrate is annealed whereby heavily doped source and drain regions are formed within the semiconductor substrate not covered by the gate electrode and the silicon oxide and silicon nitride spacers. An oxide layer is grown over the heavily doped source and drain regions. Thereafter, the silicon nitride spacers are removed. Second ions are implanted to form lightly doped regions in the semiconductor substrate not covered by the oxide layer. Third ions are implanted to form a halo having opposite dosage and a deeper junction than the lightly doped regions. An insulating layer is deposited over the surface of the substrate. An opening is provided through the insulating layer to one of the source and drain regions. A conducting layer is deposited overlying the insulating layer and within the opening and patterned completing the fabrication of the integrated circuit device.

Also in accordance with the objects of the invention, an integrated circuit device having an LDD structure including a self-aligned halo implant is described. A gate electrode overlies a gate silicon oxide layer on the surface of a semiconductor substrate. A silicon oxide layer lies on the top surface and sidewalls of the gate electrode. Lightly doped source and drain regions lie within the semiconductor substrate not covered by the gate electrode and the silicon oxide sidewall layer. Heavily doped source and drain regions lie within the semiconductor substrate not covered by the gate electrode and adjacent to the lightly doped source and drain regions. A protective oxide layer overlies the heavily doped source and drain regions. A halo implant underlies the lightly doped source and drain regions in the semiconductor substrate not covered by the protective oxide layer. An insulating layer overlies the silicon oxide layer, the protective oxide layer and the surface of the substrate and a patterned conducting layer overlies the insulating layer and extends through an opening in the insulating layer and the protective oxide layer to one of the heavily doped source and drain regions.

BRIEF DESCRIPTION OF THE DRAWINGS

In the accompanying drawings forming a material part of this description, there is shown.

DESCRIPTION OF THE PREFERRED EMBODIMENTS

Figure 1:
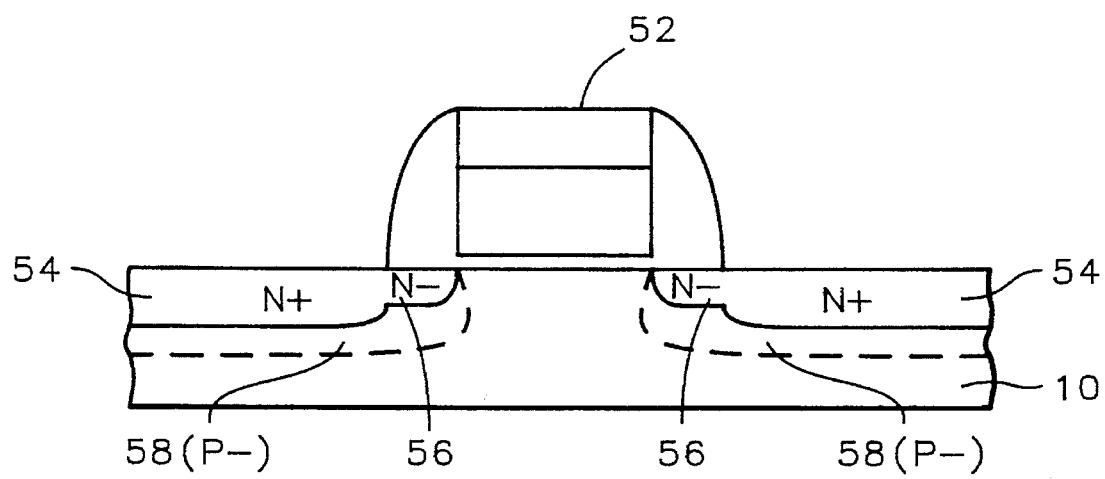
FIG. 1 schematically illustrates in cross-sectional representation a halo of the prior art.
Figure 2:
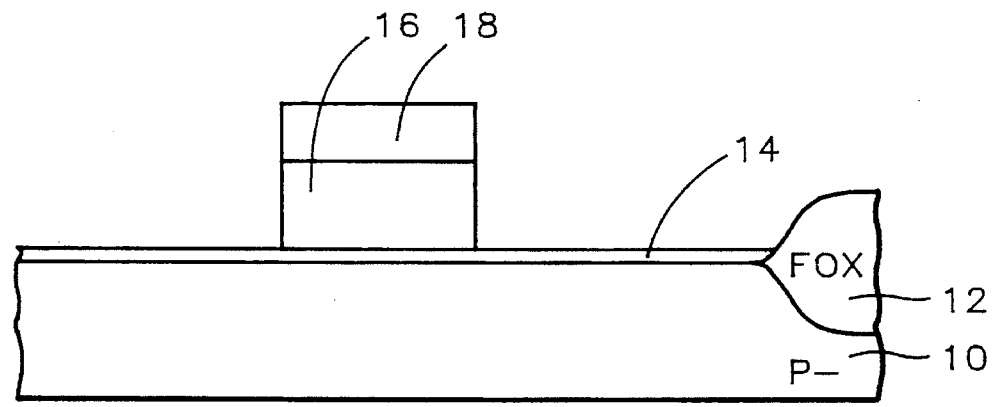
FIGS. 2 through 12 schematically illustrate in cross-sectional representation a preferred embodiment of the present invention.

Referring now more particularly to FIG. 2, there is shown an illustration of the N channel portion of a partially completed, CMOS metal oxide field effect transistor (MOSFET). The semiconductor substrate 10 is preferably composed of silicon having a (100) crystallographic orientation. In an effort to simplify the description and the drawings the dielectric isolation between devices has been only partially shown and will not be described in detail, because they are conventional. For example, Field oxide regions 12 are formed to isolate active areas. Then semiconductor devices can be provided in the silicon mesas according to the following processes.

The surface of the silicon substrate 10 is thermally oxidized to form the desired gate oxide 14 thickness. The preferred thickness is between about 30 to 200 Angstroms.

The polysilicon or polycide layer 16 is deposited by low pressure chemical vapor deposition (LPCVD) to a thickness of between about 1000 to 4000 Angstroms. A capping oxide layer 18 is formed over the polysilicon or polycide layer to a thickness of between about 300 to 600 Angstroms. A layer of photoresist is coated over the cap oxide layer and patterned as is conventional in the art to form a photoresist mask where gate electrodes and/or interconnecting lines are to be formed. The polysilicon or polycide layer 16 and the cap oxide layer 18 are etched away where they are not covered by the mask to form a gate electrode.

Figure 3:
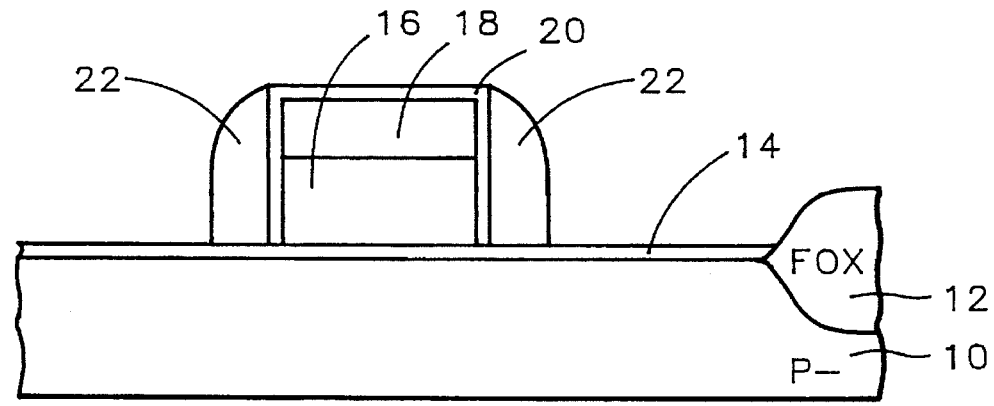

Referring now to FIG. 3, thin oxide spacers 20 are grown or deposited on the top and sidewalls of the gate electrode to a thickness of between about 100 to 200 Angstroms. A layer of silicon nitride is deposited and etched away to leave silicon nitride spacers 22 on the sidewalls of the gate electrode, as shown in FIG. 3.

The source/drain structure of the MOSFET may now be formed. FIGS. 2 through 12 show only the N channel MOSFET portion of a CMOS integrated circuit device. It is well understood by those skilled in the art that the P channel portion can be formed by simply substituting opposite polarities to those given for the N channel embodiment.

Figure 4:
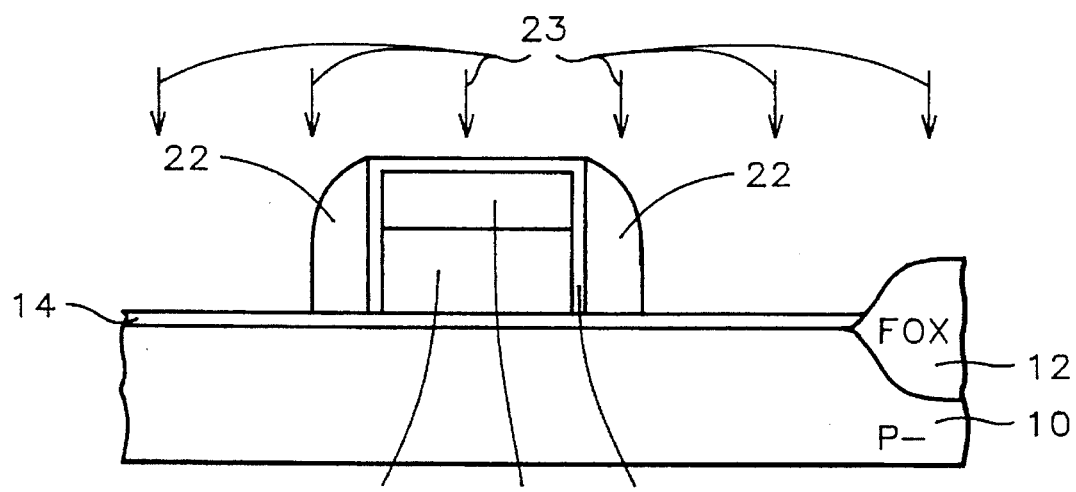
Figure 5:
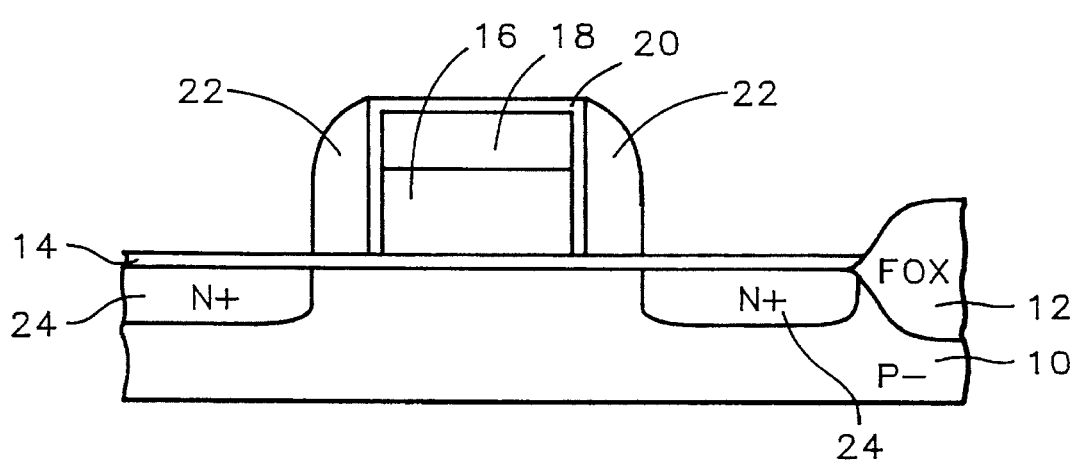

Referring now to FIG. 4, the LDD source/drain regions are formed by the ion implantation of N+ ions 23, such as phosphorus or arsenic. Typically, N+ ions are implanted at a dosage of between about 1 E 14 to 8 E 15 at an energy of between about 5 to 80 KeV. For P+ regions, boron or $BF_2$ ions are used. The substrate is annealed, for example at a temperature of between about 850° to 1100° C. for between about 0.2 to 30 minutes, to drive in the impurities. Heavily doped regions 24 are shown in FIG. 5.

Figure 6:
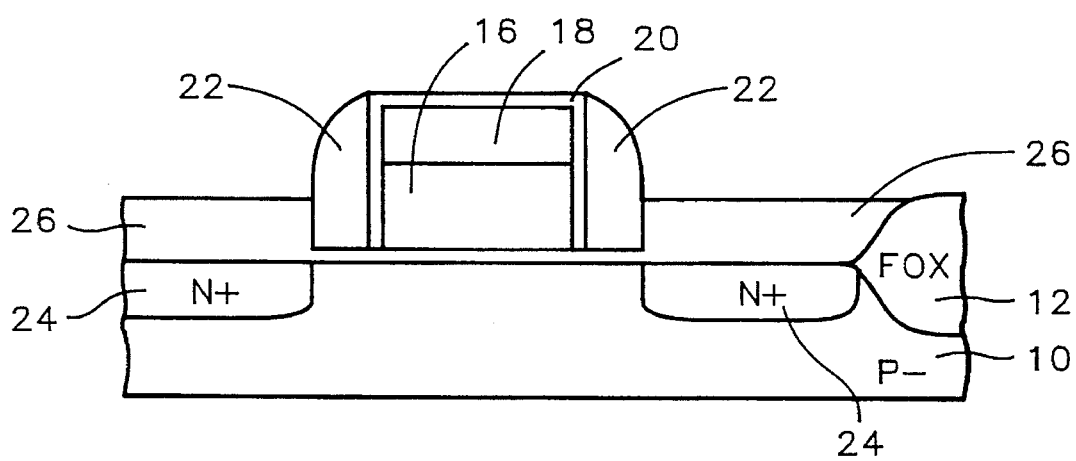

Referring now to FIG. 6, the key feature of the present invention will be described. An oxide layer 26 is grown on the surfaces of the source and drain regions 24. The oxide layer 26 is grown to a thickness of between about 600 to 1200 Angstroms over the source and drain regions 24. This layer will serve to block the LDD and the halo implants after the removal of the silicon nitride spacers.

Figure 7:
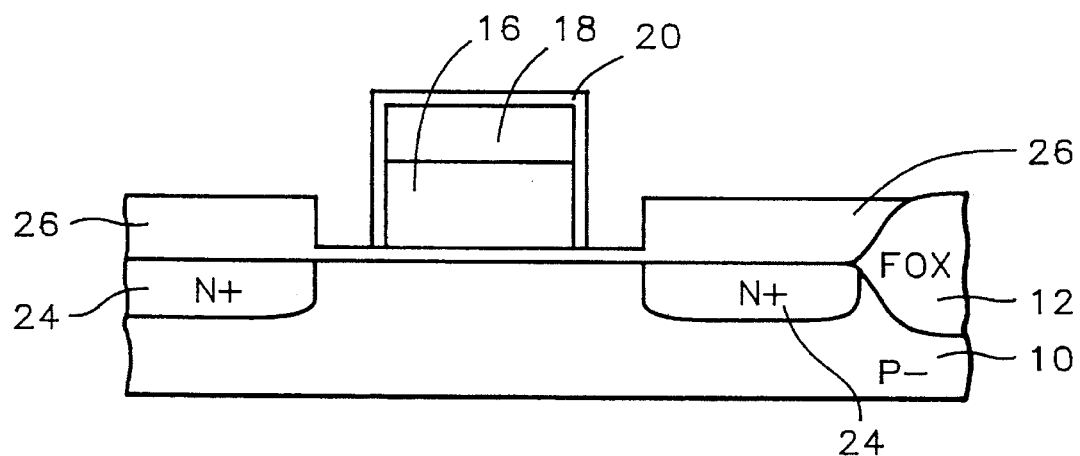

The silicon nitride sidewalls 22 are stripped, resulting in FIG. 7.

Figure 8:
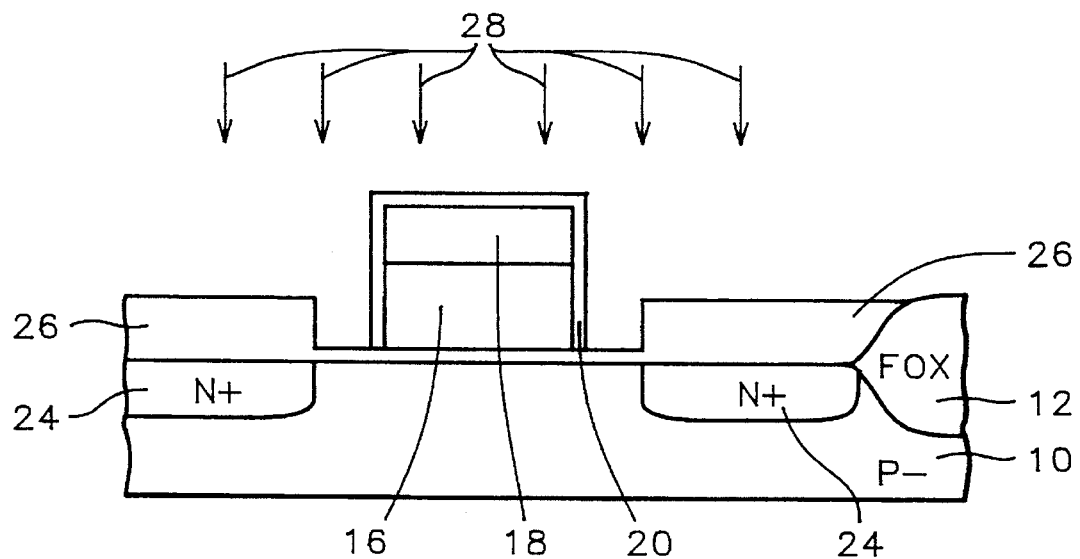

Next, referring to FIG. 8, the lightly doped drain (LDD) N− regions are formed by implanting ions 28. Typically, arsenic or phosphorus ions are implanted with a dosage of between about 1 E 13 to 1 E 14 atoms/cm$^2$ at an energy of between about 5 to 80 KeV at a vertical angle.

Figure 9:
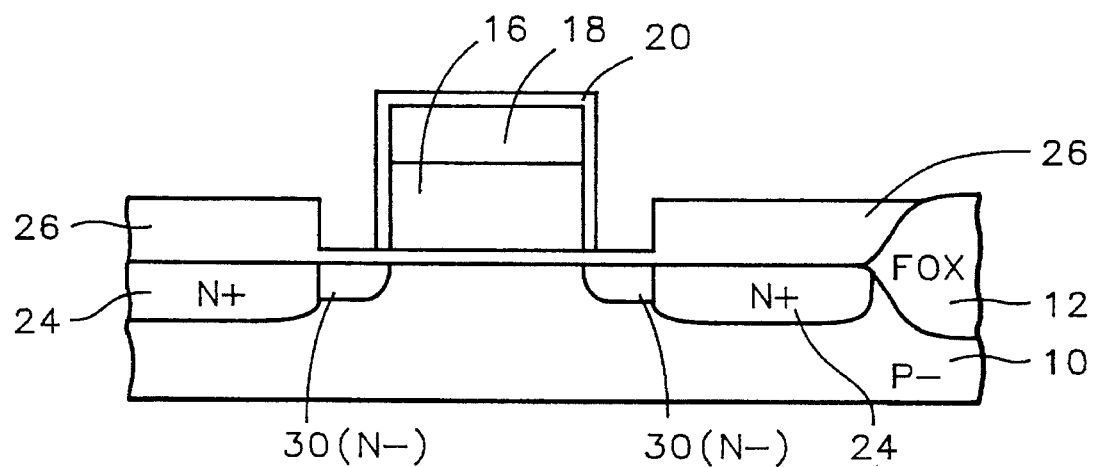

The ion implantation 28 forms lightly doped N-regions 30, as illustrated in FIG. 9.

Figure 10:
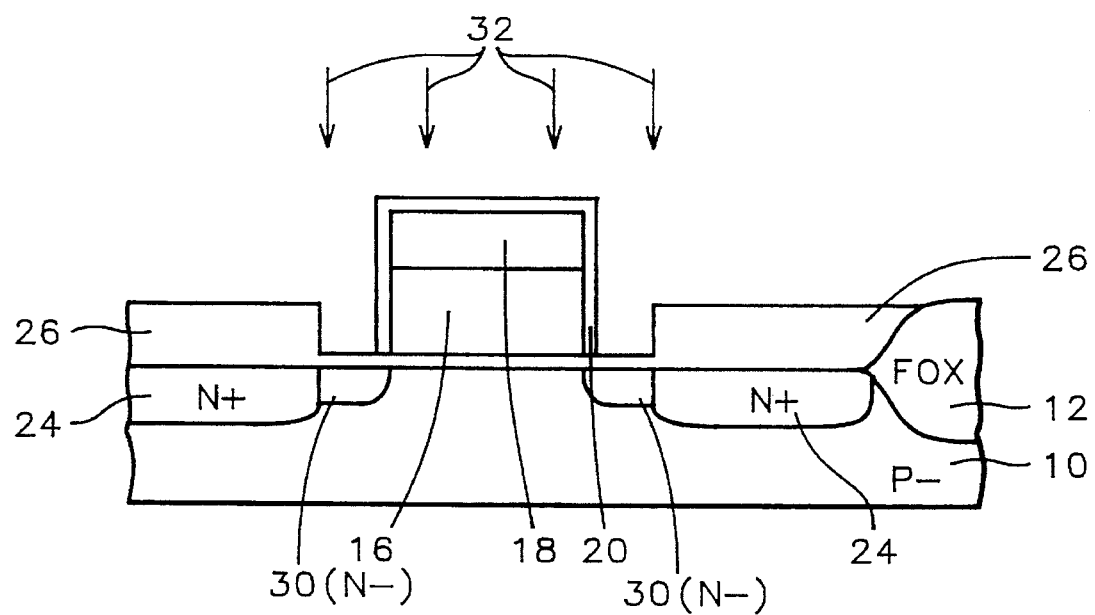

The halo is now to be implanted. Referring to FIG. 10, boron or $BF_2$ ions are implanted 32 with a dosage of between about 1 E 13 to 1 E 14 atoms/cm$^2$ at a higher energy than that used for the LDD implantation, at between about 60 to 120 KeV, and at a tilt angle of between about 0° to 40°.

Figure 11:
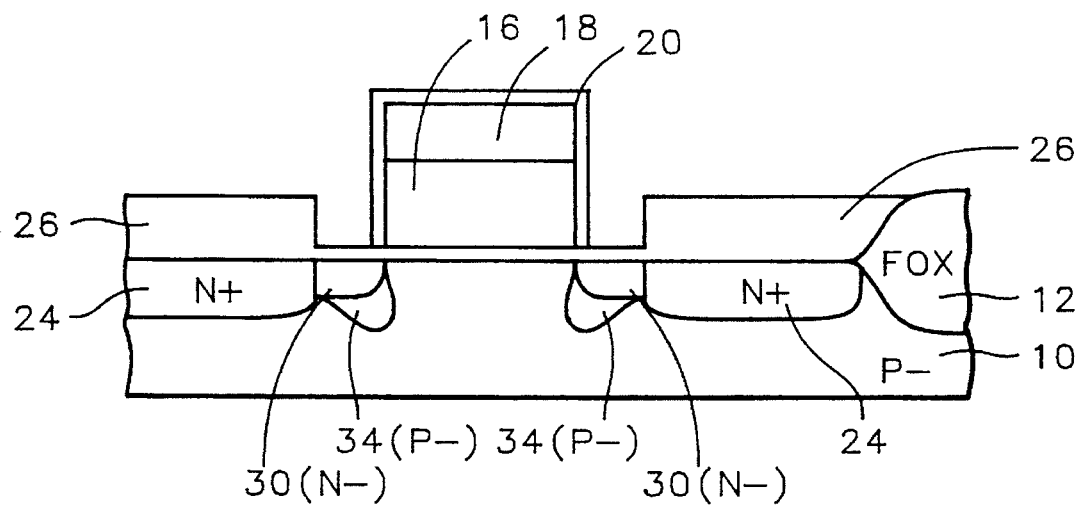

The p− halo regions 34 are illustrated in FIG. 11. The process of the invention provides a self-aligned halo which counter-dopes only the small critical region around the LDD. The halo effectively suppresses the high electrical field regions that cause punchthrough, yet the junction capacitance is not significantly increased by the presence of the halo.

Figure 12:
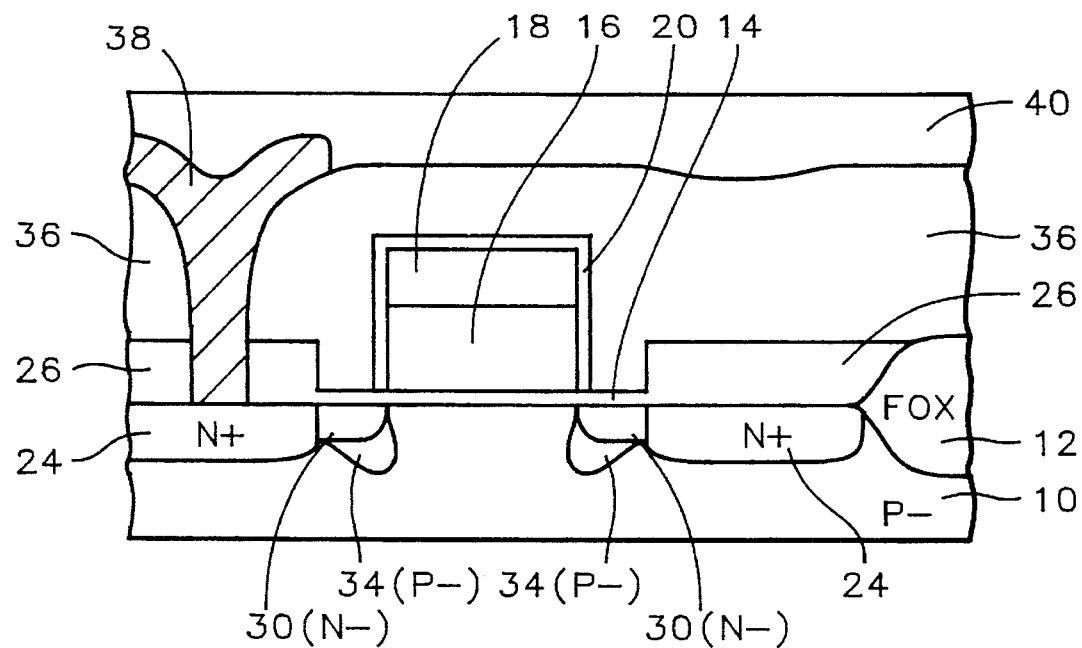

This completes the formation of the LDD structure. The integrated circuit device is completed as is conventional in the art. For example, as illustrated in FIG. 12, insulating layer 36 is deposited over the surface of the substrate. Contact openings are made through the insulating layer to the underlying semiconductor devices, such as to a source/drain region 24. A metal layer 38 is deposited and patterned to form electrical connections between the elements of the integrated circuit. A passivation layer 40 completes the fabrication of the integrated circuit.

The process of the invention provides a method of forming an LDD structure using a halo that suppresses the short channel effect while not increasing junction capacitance and, consequently, improving the speed performance of the integrated circuit device.

Referring now to FIG. 12, the integrated circuit device of the present invention having an LDD structure including a self-aligned halo implant is described. A gate electrode 16 overlies a gate silicon oxide layer 14 on the surface of a semiconductor substrate 10. A silicon oxide layer 20 lies on the top surface and sidewalls of the gate electrode. Lightly doped source and drain regions 30 lie within the semiconductor substrate not covered by the gate electrode and the silicon oxide sidewall layer. Heavily doped source and drain regions 24 lie within the semiconductor substrate not covered by the gate electrode and adjacent to the lightly doped source and drain regions. A protective oxide layer 26 overlies the heavily doped source and drain regions 24. A halo implant 34 underlies the lightly doped source and drain regions 30 in the semiconductor substrate not covered by the protective oxide layer 26. An insulating layer 36 overlies the silicon oxide layer 20, the protective oxide layer 26 and the surface of the substrate and a patterned conducting layer 38 overlies the insulating layer and extends through an opening in the insulating layer and the protective oxide layer to one of the heavily doped source and drain regions 24. A passivation layer 40 completes the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a layer of gate silicon oxide over the surface of a semiconductor substrate;

forming a gate electrode overlying said gate silicon oxide layer;

forming a silicon oxide layer having sidewalls on the top surface and sidewalls of said gate electrode;

forming silicon nitride spacers on the sidewalls of said silicon oxide sidewall layer;

implanting first ions into said semiconductor substrate and annealing said substrate whereby heavily doped source and drain regions are formed within said semiconductor substrate not covered by said gate electrode and said silicon oxide sidewall layer and said silicon nitride spacers;

growing a protective oxide layer over said heavily doped source and drain regions;

thereafter removing said silicon nitride spacers;

implanting second ions with a first dosage at a first energy to form lightly doped regions in said semiconductor substrate not covered by said protective oxide layer;

thereafter implanting third ions with a second dosage at a second energy wherein said third ions are of opposite polarity to said second ions and wherein said second energy is higher than said first energy whereby a halo is formed deeper than said lightly doped regions in said semiconductor substrate not covered by said protective oxide layer;

depositing an insulating layer over the surface of said substrate;

providing an opening through said insulating layer to one of said source and drain regions;

depositing a conducting layer overlying said insulating layer and within said opening and patterning said conducting layer completing the fabrication of said integrated circuit device.

2. The method according to claim 1 wherein said gate electrode is formed by the steps of:

depositing a layer of polysilicon over said gate silicon oxide layer;

depositing a silicon oxide capping layer over said polysilicon layer; and etching away said polysilicon and said silicon oxide capping layers not covered by a mask to form said gate electrode.

3. The method according to claim 1 wherein said gate electrode is formed by the steps of:

depositing a layer of polycide over said gate silicon oxide layer;

depositing a silicon oxide capping layer over said polycide layer; and etching away said polycide and said silicon oxide capping layers not covered by a mask to form said gate electrode.

4. The method according to claim 1 wherein said silicon oxide layer has a thickness of between about 100 to 200 Angstroms.

5. The method according to claim 1 wherein said silicon nitride spacers have a width of between about 1000 to 500 Angstroms.

6. The method according to claim 1 wherein said first ions are arsenic ions implanted at a dosage of between about 1 E 14 to 8 E 15 atoms/cm$^2$ and an energy of between about 5 to 80 KeV.

7. The method according to claim 1 wherein said first ions are phosphorus ions implanted at a dosage of between about 1 E 14 to 8 E 15 atoms/cm$^2$ and an energy of between about 5 to 80 KeV.

8. The method according to claim 1 wherein said protective oxide layer is grown to a thickness of between about 600 to 1200 Angstroms.

9. The method according to claim 1 wherein said second ions are phosphorus ions implanted at a dosage of between about 1 E 13 to 1 E 14 atoms/cm$^2$ and an energy of between about 5 to 80 KeV.

10. The method according to claim 1 wherein said second ions are arsenic ions implanted at a dosage of between about 1 E 13 to 1 E 14 atoms/cm$^2$ and an energy of between about 5 to 80 KeV.

11. The method according to claim 1 wherein said second ions are implanted at a vertical angle.

12. The method according to claim 1 wherein said third ions are boron ions implanted at a dosage of between about 1 E 13 to 1 E 14 atoms/cm$^2$ and an energy of between about 60 to 120 KeV.

13. The method according to claim 1 wherein said third ions are BF$_2$ ions implanted at a dosage of between about 1 E 13 to 1 E 14 atoms/cm$^2$ and an energy of between about 60 to 120 KeV.

14. The method according to claim 1 wherein said third ions are implanted at a tilt angle of between about 0° to 40°.

15. A method of forming a LDD structure having a self-aligned halo implant in the fabrication of an integrated circuit device comprising:

providing a layer of gate silicon oxide over the surface of a semiconductor substrate;

forming a gate electrode overlying said gate silicon oxide layer;

forming a silicon oxide layer having sidewalls on the top surface and sidewalls of said gate electrode;

forming silicon nitride spacers on the sidewalls of said silicon oxide sidewall layer;

implanting first ions into said semiconductor substrate and annealing said substrate whereby heavily doped source and drain regions are formed within said semiconductor substrate not covered by said gate electrode and said silicon oxide sidewall layer and said silicon nitride spacers;

growing a protective oxide layer over said heavily doped source and drain regions;

thereafter removing said silicon nitride spacers;

implanting second ions with a first dosage at a first energy to form lightly doped regions in said semiconductor substrate not covered by said protective oxide layer; and thereafter implanting third ions with a second dosage at a second energy wherein said third ions are of opposite polarity to said second ions and wherein said second energy is higher than said first energy whereby said halo implant is formed deeper than said lightly doped regions in said semiconductor substrate not covered by said protective oxide layer completing the formation of said LDD structure having a self-aligned halo implant in the fabrication of said integrated circuit device.

16. The method according to claim 15 wherein said gate electrode is formed by the steps of:

depositing a layer of polysilicon over said gate silicon oxide layer;

depositing a silicon oxide capping layer over said polysilicon layer; and etching away said polysilicon and said silicon oxide capping layers not covered by a mask to form said gate electrode.

17. The method according to claim 15 wherein said gate electrode is formed by the steps of:

depositing a layer of polycide over said gate silicon oxide layer;

depositing a silicon oxide capping layer over said polycide layer; and etching away said polycide and said silicon oxide capping layers not covered by a mask to form said gate electrode.

18. The method according to claim 15 wherein said silicon oxide layer has a thickness of between about 100 to 200 Angstroms.

19. The method according to claim 15 wherein said silicon nitride spacers have a width of between about 1000 to 2500 Angstroms.

20. The method according to claim 15 wherein said first ions are arsenic ions implanted at a dosage of between about 1 E 14 to 8 E 15 atoms/cm$^2$ and an energy of between about 5 to 80 KeV.

21. The method according to claim 15 wherein said first ions are phosphorus ions implanted at a dosage of between about 1 E 14 to 8 E 15 atoms/cm$^2$ and an energy of between about 5 to 80 KeV.

22. The method according to claim 15 wherein said protective oxide layer is grown to a thickness of between about 600 to 1200 Angstroms.

23. The method according to claim 15 wherein said second ions are phosphorus ions implanted at a dosage of between about 1 E 13 to 1 E 14 atoms/cm$^2$ and an energy of between about 5 to 80 KeV.

24. The method according to claim 15 wherein said second ions are arsenic ions implanted at a dosage of between about 1 E 13 to 1 E 14 atoms/cm$^2$ and an energy of between about 5 to 80 KeV.

25. The method according to claim 15 wherein said second ions are implanted at a vertical angle.

26. The method according to claim 15 wherein said third ions are boron ions implanted at a dosage of between about 1 E 13 to 1 E 14 atoms/cm$^2$ and an energy of between about 60 to 120 KeV.

27. The method according to claim 15 wherein said third ions are $BF_2$ ions implanted at a dosage of between about 1 E 13 to 1 E 14 atoms/cm$^2$ and an energy of between about 60 to 120 KeV.

28. The method according to claim 15 wherein said third ions are implanted at a tilt angle of between about 0° to 40°.

* * * * *